United States Patent
Butterbaugh et al.

(10) Patent No.: US 9,691,628 B2
(45) Date of Patent: *Jun. 27, 2017

(54) PROCESS FOR SILICON NITRIDE REMOVAL SELECTIVE TO $SIGE_x$

(71) Applicant: TEL FSI, Inc., Chaska, MN (US)

(72) Inventors: Jeffery W. Butterbaugh, Eden Prairie, MN (US); Anthony S. Ratkovich, Bloomington, MN (US)

(73) Assignee: TEL FSI, INC., Chaska, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/863,126

(22) Filed: Sep. 23, 2015

(65) Prior Publication Data

US 2016/0013068 A1 Jan. 14, 2016

Related U.S. Application Data

(63) Continuation-in-part of application No. 13/834,398, filed on Mar. 15, 2013, which is a
(Continued)

(51) Int. Cl.
| | |
|---|---|
| *H01L 21/311* | (2006.01) |
| *H01L 21/306* | (2006.01) |
| *H01L 21/3213* | (2006.01) |
| *H01L 21/67* | (2006.01) |
| *B81C 1/00* | (2006.01) |

(Continued)

(52) U.S. Cl.
CPC .... *H01L 21/31111* (2013.01); *B81C 1/00539* (2013.01); *H01L 21/30604* (2013.01); *H01L 21/32133* (2013.01); *H01L 21/32134* (2013.01); *H01L 21/6708* (2013.01); *H01L 21/67075* (2013.01); *H01L 29/66545* (2013.01); *H01L 29/66628* (2013.01); *H01L 29/66636* (2013.01); *H01L 29/7848* (2013.01)

(58) Field of Classification Search
None
See application file for complete search history.

(56) References Cited

U.S. PATENT DOCUMENTS 6,087,273 A * 7/2000 Torek ................ H01L 21/31111
216/99
2008/0064223 A1 3/2008 Eguchi et al.
(Continued)

FOREIGN PATENT DOCUMENTS

TW 200814181 A 3/2008

*Primary Examiner* — Jiong-Ping Lu
(74) *Attorney, Agent, or Firm* — Kagan Binder, PLLC

(57) ABSTRACT

A method for selectively removing silicon nitride is described. In particular, the method includes providing a substrate having a surface with silicon nitride exposed on at least one portion of the surface and $SiGe_x$ (x is greater than or equal to zero) exposed on at least another portion of the surface, and dispensing an oxidizing agent onto the surface of the substrate to oxidize the exposed $SiGe_x$. Thereafter, the method includes dispensing a silicon nitride etching agent as a liquid stream onto the surface of the substrate to remove at least a portion of the silicon nitride.

17 Claims, 6 Drawing Sheets

Related U.S. Application Data continuation-in-part of application No. 13/312,148, filed on Dec. 6, 2011, now Pat. No. 9,059,104.

(60) Provisional application No. 61/421,808, filed on Dec. 10, 2010.

(51) Int. Cl.
*H01L 29/66* (2006.01)
*H01L 29/78* (2006.01)

(56) References Cited

U.S. PATENT DOCUMENTS

| | | | | |
|---|---|---|---|---|
| 2008/0283090 A1* | 11/2008 | DeKraker | ............... | G03F 7/423 134/3 |
| 2009/0173986 A1* | 7/2009 | Sohn | ................. | H01L 29/42324 257/315 |
| 2010/0304542 A1* | 12/2010 | Beyer | ............... | H01L 21/28079 438/299 |
| 2011/0254090 A1* | 10/2011 | Cheng | ............... | H01L 29/66772 257/347 |

* cited by examiner

PROCESS FOR SILICON NITRIDE REMOVAL SELECTIVE TO SIGE$_x$

CROSS-REFERENCE TO RELATED APPLICATIONS

This application is a continuation-in-part of allowed U.S. patent application Ser. No. 13/834,398, entitled "PROCESS FOR SILICON NITRIDE REMOVAL SELECTIVE TO SiGe$_x$", filed Mar. 15, 2015, which is a continuation-in-part of granted U.S. patent application Ser. No. 13/312,148, entitled "PROCESS FOR SELECTIVELY REMOVING NITRIDE FROM SUBSTRATES", granted as U.S. Pat. No. 9,059,104, and filed on Dec. 6, 2011. The entire content of this application is herein incorporated by reference. U.S. patent application Ser. No. 13/312,148 in turn claims priority to U.S. patent application Ser. No. 61/421,808, filed on Dec. 10, 2010.

BACKGROUND OF THE INVENTION

Field of Invention

The invention relates to a method for removing material from a substrate, and in particular, a method for selectively removing silicon nitride from a substrate.

Description of Related Art

Typically, during fabrication of integrated circuits (ICs), semiconductor production equipment utilize a (wet) etching or cleaning process to remove or etch material from target locations on a semiconductor substrate. The success of the etching process requires an etching chemistry that includes chemical reactants suitable for selectively removing one material while substantially not removing another material. Various compositions have been developed for removal of specific classes of materials from substrates in semiconductor wafer technologies.

For example, silicon nitride is commonly used in semiconductor processing as a cap layer, spacer layer, or hard mask layer, to name a few, during the formation of various devices. In these processing techniques, at least a portion of the silicon nitride layer is selectively removed via an etching process. In particular, the silicon nitride layer is selectively removed relative to silicon oxide. One technique includes submersing the substrate comprising silicon nitride in a bath of boiling H$_3$PO$_4$, which has been shown to achieve a selectivity of about 35:1 for etching silicon nitride relative to silicon dioxide.

However, even with this success, it remains desirable to identify alternative techniques and compositions for treatment of substrates, particularly to remove nitride materials, especially silicon nitride, from substrates such as semiconductor wafers with selectivity to, for example, silicon and silicon-germanium alloys.

SUMMARY OF THE INVENTION

Embodiments of the invention relate to a method for removing material from a substrate, and in particular, a method for selectively removing silicon nitride from a substrate.

According to one embodiment, a method for selectively removing silicon nitride is described. In particular, the method includes providing a substrate having a surface with silicon nitride exposed on at least one portion of the surface and SiGe$_x$, wherein x is greater than or equal to zero, exposed on at least another portion of the surface, and dispensing an oxidizing agent onto the surface of the substrate to oxidize the exposed SiGe$_x$. Thereafter, the method includes dispensing a silicon nitride etching agent as a liquid stream onto the surface of the substrate to remove at least a portion of the silicon nitride.

DETAILED DESCRIPTION OF SEVERAL EMBODIMENTS

Methods for selectively removing material from a substrate are described in various embodiments. One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

"Substrate" as used herein generically refers to the object being processed in accordance with the invention. The substrate may include any material portion or structure of a device, particularly a semiconductor or other electronics device, and may, for example, be a base substrate structure, such as a semiconductor wafer or a layer on or overlying a base substrate structure such as a thin film. Thus, substrate is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation.

Figure 1A:
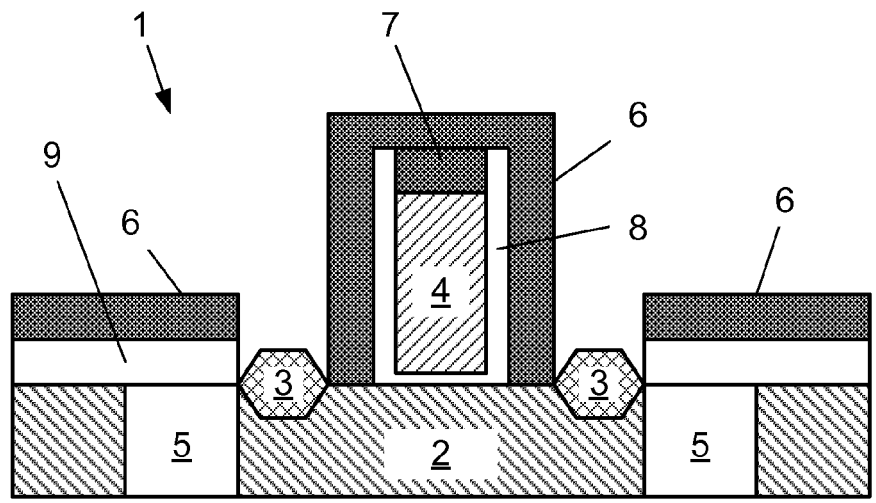
FIGS. 1A through 1C depict a semiconductor device.

As noted above, removal processes, such as etching and cleaning, for use in semiconductor device manufacturing require chemical compositions that achieve selectivity of one material relative to another material, i.e., one material is selectively removed while another material remains substantially unaffected. FIG. 1A depicts a schematic cross-section of a semiconductor device 1, such as a gate structure.

The semiconductor device 1 includes substrate 2, such as a monocrystalline Si substrate, a $SiGe_x$ region 3 (wherein x is greater than or equal to 0), and an isolation region 5. The $SiGe_x$ region 3 may include Si, Ge, or SiGe alloy. The isolation region 3 may include silicon oxide ($SiO_y$, wherein y is greater than or equal to 0). The semiconductor device 1 further includes a gate region having gate 4, gate dielectric and spacer 8, gate cap layer 7, silicon nitride layer 6, and silicon oxide layer 9.

Figure 1B:
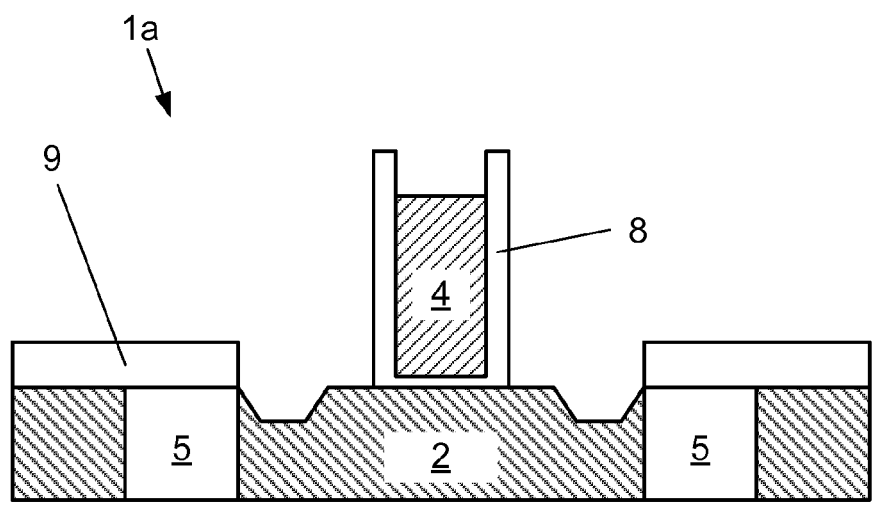
Figure 1C:
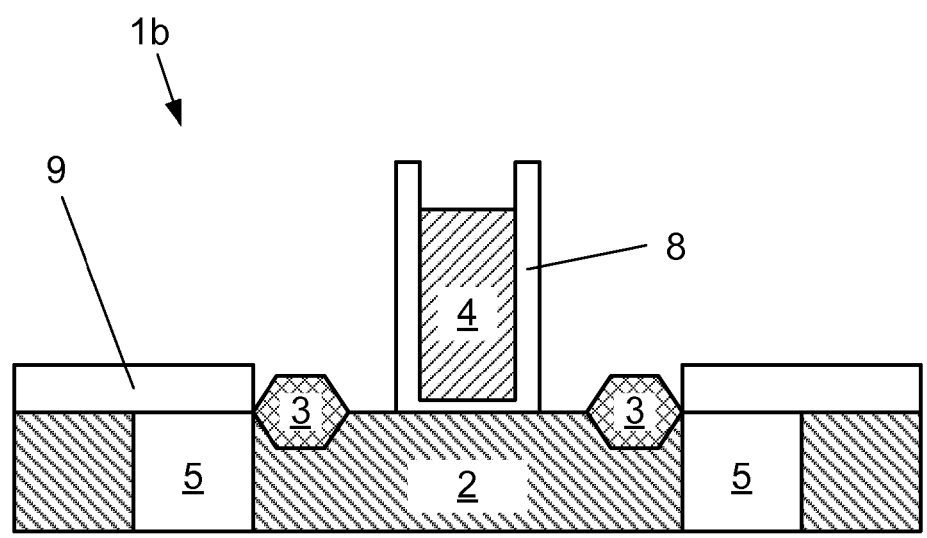
Figure 2:
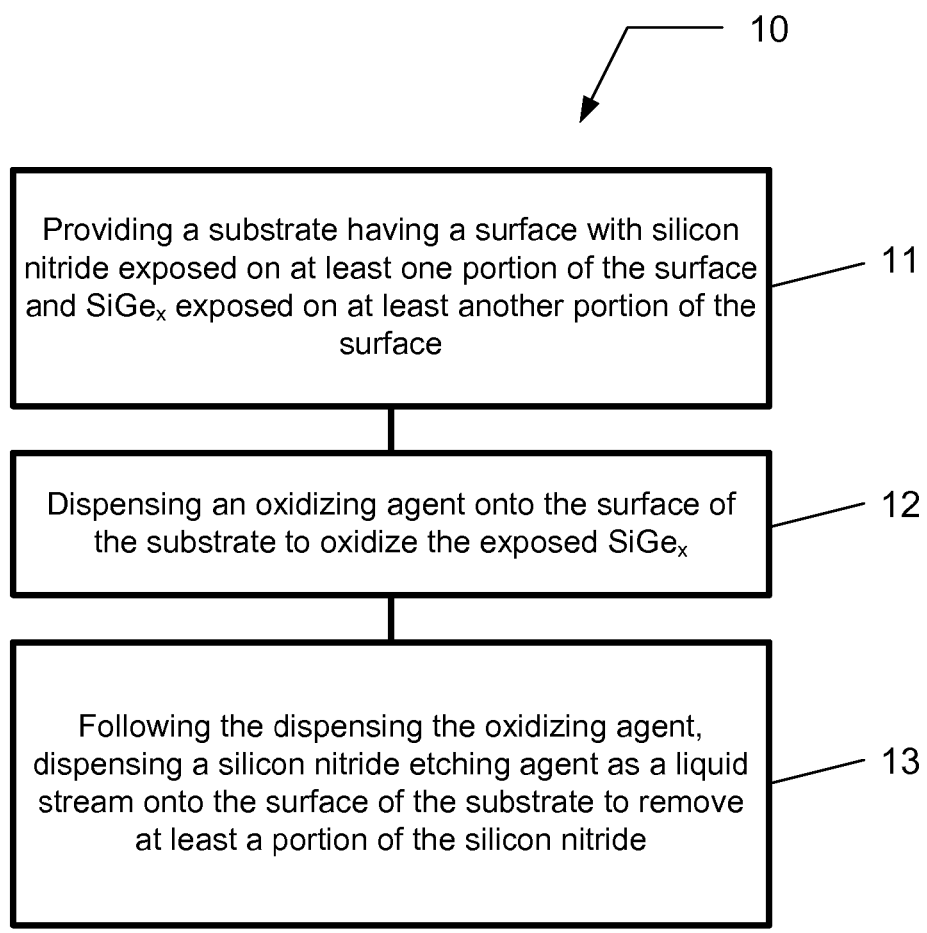
FIG. 2 illustrates a method for selectively removing silicon nitride according to an embodiment.

At this intermediate stage of fabrication, the silicon nitride layer 6 is exposed, and it is necessary to preferentially remove the silicon nitride layer 6 from the substrate relative to other materials being retained on the substrate, such as $SiGe_x$ region 3 and silicon oxide layer 9. With conventional removal processes, the silicon nitride layer 6 may be removed, but at the expense of removing the $SiGe_x$ region 3, which is unacceptable (see FIG. 1B). As shown in FIG. 1C, the silicon nitride layer 6 must be removed without removing the $SiGe_x$ region 3.

Figure 3:
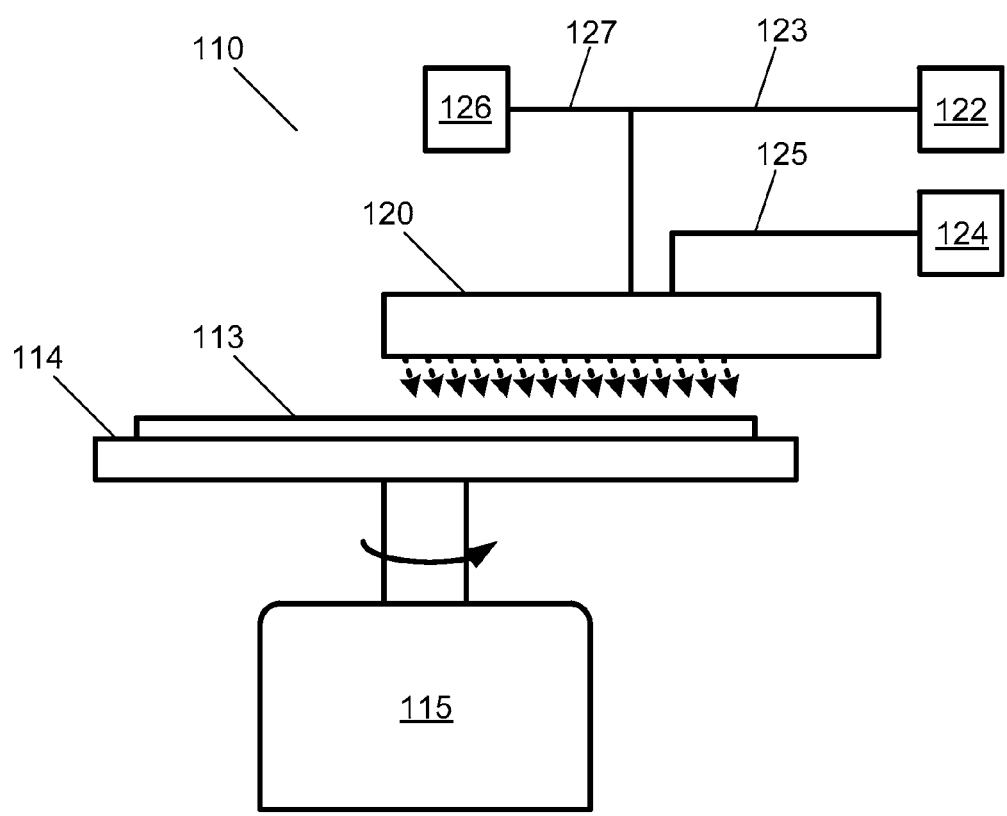
FIG. 3 is a schematic diagram of an apparatus that can carry out an embodiment of the process of the present invention.

Therefore, according to an embodiment, a method of removing the silicon nitride layer 6 with selectivity to the $SiGe_x$ region 3 is described according to various embodiments. Referring now to FIG. 3, a method for selectively removing silicon nitride is illustrated according to an embodiment. The method includes a flow chart 10 beginning in 11 with providing a substrate having a surface with silicon nitride exposed on at least one portion of the surface and $SiGe_x$, wherein x is greater than or equal to zero, exposed on at least another portion of the surface. The $SiGe_x$ may include Si, Ge, or SiGe alloy.

In 12, an oxidizing agent is dispensed onto the surface of the substrate to oxidize the exposed $SiGe_x$. In one example, the dispensing of the oxidizing agent may include exposing the substrate to a mixture containing sulfuric acid and hydrogen peroxide. The sulfuric acid may be heated to a temperature in excess of 150 degrees C., or alternatively, to a temperature in excess of 200 degrees C. Furthermore, water, such as steam, may be added to the mixture of sulfuric acid and hydrogen peroxide. Other oxidizing agents are also contemplated. For instance, the oxidizing agent may include a peroxide, such as hydrogen peroxide, or other oxidizing media, e.g., ozone or aqueous ozone.

In another example, the dispensing of the oxidizing agent may include exposing the substrate to a mixture containing sulfuric acid and hydrogen peroxide in the presence of water vapor. The mixture containing sulfuric acid and hydrogen peroxide may be dispensed from a first array of injection openings located above the substrate, and the water vapor may be dispensed from a second array of openings. Additionally, the first array of openings and the second array of openings may be oriented relative to one another to allow the mixture of sulfuric acid and hydrogen peroxide and the water vapor to mix in a space above the substrate. Furthermore, the first array of openings and the second array of openings may be distributed radially along a spray arm that extends above the substrate from approximately a central region of the substrate to approximately a peripheral region of the substrate. Further yet, the substrate may be rotated while dispensing the mixture of sulfuric acid and hydrogen peroxide and the water vapor.

In 13, a silicon nitride etching agent is dispensed as a liquid stream onto the surface of the substrate to remove at least a portion of the silicon nitride, following the dispensing of the oxidizing agent. The dispensing of a silicon nitride etching agent may comprise dispensing sulfuric acid, or phosphoric acid, or both sulfuric and phosphoric acid. For instance, the dispensing of a silicon nitride etching agent may comprise dispensing phosphoric acid and sulfuric acid onto the surface of the substrate as a mixed acid liquid stream at a temperature greater than about 150 degrees C. Water may be added to a liquid solution of the mixed acid liquid stream as or after the liquid solution of the mixed acid liquid stream passes through a nozzle. Furthermore, the substrate may be rotated during the dispensing of the mixed acid stream.

The mixed acid liquid stream may be flowed onto the substrate in the form of a continuous stream or may be sprayed onto the substrate in the form of liquid aerosol droplets. In one example, the phosphoric acid and sulfuric acid are mixed in a vessel for storage prior to dispensing from a nozzle as the mixed acid liquid stream. In another example, the phosphoric acid and sulfuric acid are mixed in-line at a location upstream from a nozzle to form the mixed acid liquid stream, or the phosphoric acid and sulfuric acid are mixed in a nozzle assembly prior to being ejected from a nozzle as the mixed acid liquid stream. In yet another example, the phosphoric acid and sulfuric acid are dispensed as separate liquid solutions in the form of streams from separate orifices of a nozzle assembly, which separate streams then impinge and form the mixed acid liquid stream externally of the nozzle and prior to contact with the surface of the substrate.

The constituents of the mixed acid liquid stream can be heated to the desired application temperature at any desired location in the dispensing process. For example, the constituents can be individually preheated and then mixed, or can be mixed and then heated to the desired temperature. The constituents can be heated in bulk, or in the process line in an on-demand basis.

In one embodiment, the mixed acid liquid stream is prepared by mixing a phosphoric acid solution that is at least about 80% by weight phosphoric acid with a sulfuric acid solution that is at least about 90% by weight sulfuric acid in a volume ratio of phosphoric acid to sulfuric acid that lies within the range from 3:1 to 1:6. In another embodiment, the phosphoric acid solution is 85% (by weight) phosphoric acid and the sulfuric acid solution is 98% (by weight) sulfuric acid. In another embodiment, the volume ratio of phosphoric acid to sulfuric acid lies within the range of 1:2 to 1:4.

In a preferred embodiment, the liquid sulfuric acid solution has a water/sulfuric acid molar ratio of no greater than about 5:1. Thus, the liquid sulfuric acid solution is limited in water content. In one embodiment, the liquid sulfuric acid solution may comprise a solvent that does not substantially interfere with the coordination of subsequently added water (and preferably water vapor) with sulfuric acid, as discussed in more detail herein. Preferred solvents may include inert materials with respect to the substrate to be treated (e.g., the substrate), such as fluorine based liquids. One example of an inert solvent includes a solvent selected from the FLUORINERT™ solvent family, commercially available from 3M (St. Paul, Minn.).

It should be noted that the above mentioned molar ratio recites the water/sulfuric acid molar ratio, and not the solvent/sulfuric acid ratio. This underscores the significance of the criterion that the solvent that does not substantially interfere with the coordination of subsequently added water with sulfuric acid and does not factor into this ratio. More preferably, the liquid sulfuric acid composition may be highly concentrated. Preferably, the liquid sulfuric acid solution is dispensed at a sulfuric acid concentration of at least about 80 v/v %, more preferably at least about 90 v/v %, and most preferably at least about 94 v/v %.

Water may be added to a liquid solution of the mixed acid liquid stream as or after the liquid solution of the mixed acid liquid stream passes through a nozzle. It has been found that addition of water to the system immediately prior to application of the mixed acid liquid stream to the substrate provides a number of benefits. First, the mixed acid liquid stream may be readily heated to a higher temperature than more dilute solutions having water added at an earlier stage. The reason is the boiling point of concentrated acid is higher than the boiling point of a diluted acid. Additionally, when the liquid water is added to concentrated sulfuric acid, in particular, the resulting mixture is beneficially heated in the mixing process by the heat of mixing of these solutions.

A particular advantage exists when water is added as water vapor or steam. Water vapor has more energy in the vapor-phase than in the liquid phase, which corresponds roughly to the heat of vaporization stored in the water vapor. While not being bound by theory, water vapor may additionally be in a more reactive state relative to silicon nitride than water in the liquid state or at a lower temperature. While still not being bound by theory, it is further believed that the concentrated liquid sulfuric acid composition of the mixed acid liquid stream has a desiccating effect, thereby causing water from the water vapor to be condensed into the mixed acid liquid stream and releasing the energy corresponding roughly to the heat of vaporization stored in the water vapor.

For purposes of the present invention, water vapor is defined as water in the gaseous form, and distinguished from small droplets of water commonly called "mist." Because mist is water that is condensed in the form of small droplets, there is essentially no net warming effect when mist settles on a surface that would correspond to a heat of vaporization. For purposes of the present invention, steam is vaporized water at or above the boiling point of water, which depends on the pressure, e.g. 100 degrees C. if the pressure is 1 atmosphere. When steam is provided at a temperature greater than the boiling point of water, is it called superheated steam. Water vapor optionally may be provided from compositions comprising ingredients in addition to water, such as dissolved gasses (e.g., nitrogen). It is contemplated that water vapor may be supplied in any manner, either essentially pure, or in compositions, either above, or below or at 100 degrees C., and having pressures or partial pressures of water vapor either above, below, or at 1 atm.

It has been found that mixing, in particular, a concentrated sulfuric acid solution with a water-containing solution, as described above, is an exothermic interaction, liberating heat energy. It, therefore, is advantageous to mix these solutions immediately prior to application of the mixed acid liquid stream to the substrate in order to utilize this extra energy and promote a higher etch rate. Also, this exothermic effect may allow the liquid acid solutions to be heated to a lower initial temperature, such as 150 degrees C., before mixing with water or, in particular, steam. In addition, treating the substrate with this chemical mixture in the presence of steam or water vapor, or simultaneously dispensing steam or water vapor while pouring or dispensing the chemical mixture may provide additional temperature increase as it is expected that the dissolution of steam into the mixed acid liquid stream having a high concentration of sulfuric acid will produce an additional exotherm, or release of energy.

In other embodiments, the silicon nitride etching agent may include HF, such as dilute, heated HF at temperatures in excess of 100 degrees C. and dilution ratios to water of order 8000:1. In yet other embodiments, the silicon nitride etching agent may include phosphoric acid and various additives, such as $NH_4F$ (ammonium fluoride), $NH_4HF_2$ (ammonium hydrogen difluoride), HF, $Si(OH)_4$ (silicic acid, or more generally $[SiO_a(OH)_{4-2a}]_b$, wherein a and b are integers), TEOS (tetraethyl orthosilicate), to name a few.

In some cases, the inventors have observed the process to exhibit excellent selectivity of silicon nitride etch as compared to silicide, monocrystalline silicon, polycrystalline silicon, silicon-germanium alloys, and silicon oxide. The method for selectively etching silicon nitride described above may be observed a wide range of temperature, and therefore, it may advantageously permit selective etching at relatively low processing temperature (i.e., from about 150 degrees C. to about 180 degrees C.). The ability to provide selective etching at such processing temperatures is advantageous for certain substrates, device parameters, or tool set-ups in which the use of higher temperature conditions is undesirable. However, nitride etch enhancement effect is more pronounced at a temperature greater than or equal to about 180 degrees C., more preferably at a temperature greater than about 200 degrees C., and preferably at a temperature in the range of about 190 degrees C. to about 240 degrees C.

Therefore, according to another embodiment, prior to dispensing the silicon nitride etching agent, a heating agent may be dispensed onto the surface of the substrate to pre-heat the substrate to a target temperature. The target temperature may exceed 150 degrees C. Furthermore, the dispensing of the oxidizing agent and dispensing of the heating agent may be performed simultaneously or overlapping one another.

According to yet another embodiment, the dispensing of an oxidizing agent onto the surface of the substrate and the dispensing of a silicon nitride etching agent as a liquid stream onto the surface of the substrate may be repeated two or more cycles to selectively remove a target amount of the silicon nitride.

Figure 4:
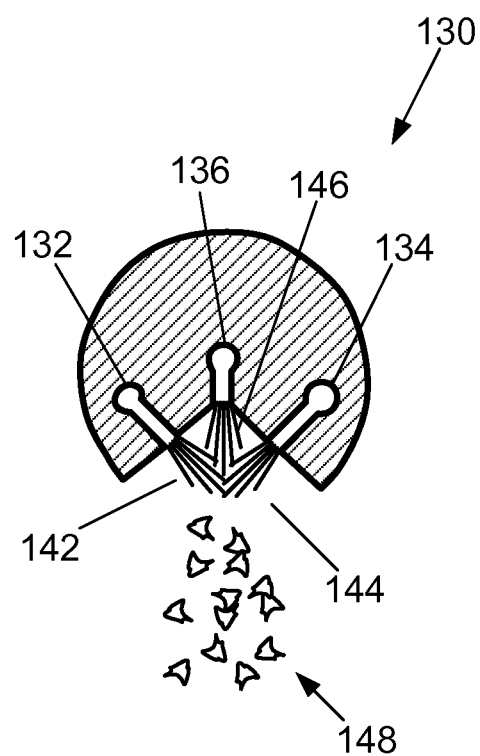
FIG. 4 is a cross sectional view of a spray bar for carrying out an embodiment of the process of the present invention.
Figure 5:
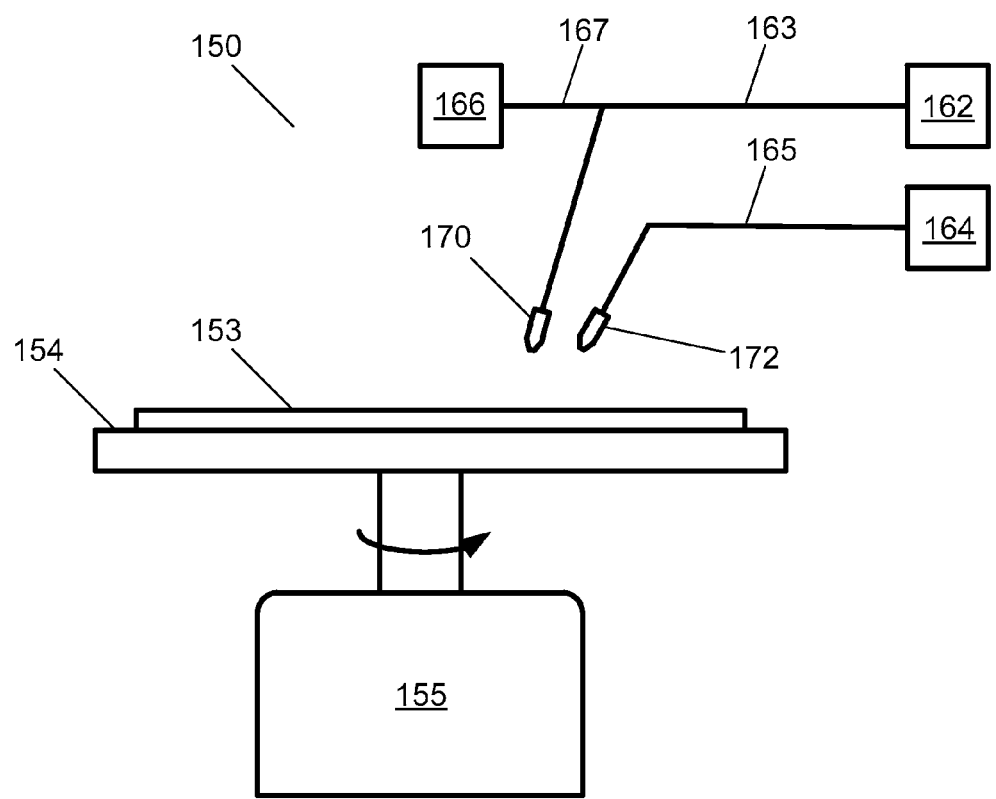
FIG. 5 is a schematic diagram of an apparatus that can carry out an embodiment of the process of the present invention.

As described above, the selective removal of silicon nitride relative to exposed $SiGe_x$ is carried out by dispensing an oxidizing agent onto a surface of the substrate to oxidize exposed $SiGe_x$. Thereafter, a silicon nitride etching agent may be used to selectively remove the silicon nitride relative to the oxidized silicon surfaces. FIGS. 3 through 5 describe an apparatus for carrying out the method for selectively removing silicon nitride according to several embodiments.

FIG. 3 shows a modified spray processing system 110 for carrying out the present invention. In system 110, wafer 113, as a particular microelectronic device for example, is supported on a rotatable chuck 114 that is driven by a spin motor 115. This portion of system 110 corresponds to a conventional spray processor device. Spray processors have generally been known, and provide an ability to remove liquids with centrifugal force by spinning or rotating the wafer(s) on a turntable or carousel, either about their own axis or about a common axis. Exemplary spray processor machines suitable for adaptation in accordance with the present invention are described in U.S. Pat. Nos. 6,406,551 and 6,488,272, which are fully incorporated herein by reference in their entireties.

Spray processor type machines are available from TEL FSI, Inc. of Chaska, Minn., e.g., under one or more of the trade designations ORION™ MERCURY™, or ZETA™. Another example of a tool system suitable for adaptation herein is described in U.S. Patent Publication No. 2007/0245954, entitled BARRIER STRUCTURE AND NOZZLE DEVICE FOR USE IN TOOLS USED TO PROCESS MICROELECTRONIC WORKPIECES WITH ONE OR MORE TREATMENT FLUIDS; or as described in U.S. Patent Application Publication No. 2005/0205115, entitled RESIST STRIPPING METHOD AND RESIST STRIPPING APPARATUS or U.S. Patent Application Publication No. 2009/0280235, entitled TOOLS AND METHODS FOR PROCESSING MICROELECTRONIC WORKPIECES USING PROCESS CHAMBER DESIGNS THAT EASILY TRANSITION BETWEEN OPEN AND CLOSED MODES OF OPERATION.

Spray bar 120 comprises a plurality of nozzles to direct liquid onto wafer 113 in the form of a continuous stream or as liquid aerosol droplets. The sulfuric acid solution is provided from liquid supply reservoir 122 through line 123, and the stream of water vapor is similarly provided from supply reservoir 124 though line 125. Phosphoric acid is provided from phosphoric acid supply reservoir 126 through line 127 to sulfuric acid supply line 123. This configuration permits addition of phosphoric acid to the sulfuric acid solution with the benefit that the phosphoric acid is not stored and heated in the presence of sulfuric acid, and additionally that the amount of phosphoric acid used in the treatment method may be independently controlled from the amount of sulfuric acid as dictated by specific process requirements. Thus, a variable phosphoric acid concentration can be applied during a treatment process as desired. Alternatively, the phosphoric acid can be supplied to the stream of water vapor at line 125.

Spray bar 120 is preferably provided with a plurality of nozzles to generate aerosol droplets of treatment composition that results from impinging the mixed acid liquid stream with the stream of water vapor. In a preferred embodiment, nozzles are provided at a spacing of about 3.5 mm in spray bar 120 at locations corresponding to either the radius of the wafer or the full diameter of the wafer when spray bar 120 is in position over wafer 13. Nozzles may optionally be provided at different spacing closer to the axis of rotation as compared to the spacing of the nozzles at the outer edge of the wafer. A preferred spray bar configuration is described in U.S. Patent Application Publication No. 2008/0008834, entitled BARRIER STRUCTURE AND NOZZLE DEVICE FOR USE IN TOOLS USED TO PROCESS MICROELECTRONIC WORKPIECES WITH ONE OR MORE TREATMENT FLUIDS.

A cross-sectional view of a spray bar 130 is shown in FIG. 4, illustrating a preferred nozzle configuration of the present invention. For purposes of the present invention, an integrally arranged set of orifices in a body that is directed to provide streams that impinge one another is considered a single nozzle. In the configuration as shown, acid liquid stream orifices 132 and 134 are directed inward to provide impinging streams 142 and 144. Water vapor dispense orifice 136 is located as shown in this embodiment between liquid acid solution orifices 132 and 134, so water vapor stream 146 impinges with liquid acid streams 142 and 144 externally of the nozzle body. As a result of this impingement, atomization occurs, thereby forming liquid aerosol droplets 148.

In addition, the droplets are given enhanced directional momentum toward the surface of the substrate because of the relatively high pressure of the water vapor stream as it exits from water vapor dispense orifice 136. This centrally located orifice in the nozzle assembly thus provides an advantageous directional aspect to assist in removal of material from the surface of the substrate. Alternatively, the positioning of the orifices may be reversed, i.e., the acid liquid stream may be dispensed from orifice 136 and water vapor may be dispensed from orifices 132 and 134.

Optionally, an additional ingredient, such as a gas, may be dispensed from one or more orifices in the nozzle assembly.

The location, direction of the streams, and relative force of the streams are selected to preferably provide a directional flow of the resulting liquid aerosol droplets, so that the droplets are directed to the surface of a substrate to effect the desired treatment.

In one embodiment, the liquid aerosol droplets are caused to contact the surface at an angle that is perpendicular to the surface of the wafer. In another embodiment, the liquid aerosol droplets are caused to contact the surface of the wafer at an angle of from about 10 to less than 90 degrees from the surface of the wafer. In another embodiment, the liquid aerosol droplets are caused to contact the surface of the wafer at an angle of from about 30 to about 60 degrees from the surface of the wafer. In an embodiment, the wafer is spinning at a rate of about 10 to about 1000 rpm during contact of the aerosol droplets with the surface of the wafer. In another embodiment, the wafer is spinning at a rate of about 50 to about 500 rpm.

The direction of the contact of the droplets with the wafer may in one embodiment be aligned with concentric circles about the axis of spin of the wafer, or in another embodiment may be partially or completely oriented away from the axis of rotation of the wafer. System 110 preferably employs suitable control equipment (not shown) to monitor and/or control one or more of fluid flow, fluid pressure, fluid temperature, combinations of these, and the like to obtain the desired process parameters in carrying out the particular process objectives to be achieved.

FIG. 5 shows an example of a modified spray processing system 150 for carrying out an aspect of the present invention, where liquid acid solution is dispensed onto a substrate surface. In system 150, wafer 153, as a particular microelectronic device for example, is supported on a rotatable chuck 154 that is driven by a spin motor 155. As above in system 110, this portion of system 150 corresponds to a conventional spray processor device. Liquid sulfuric acid solution is provided from liquid supply reservoir 162 through line 163 to dispense orifice 170, which is configured to dispense a liquid acid stream onto the substrate surface. Phosphoric acid is provided from phosphoric acid supply reservoir 166 through line 167 to sulfuric acid supply line 163. This configuration permits addition of phosphoric acid solution to the sulfuric acid solution with the benefit that the phosphoric acid is not stored and heated in the presence of sulfuric acid, and additionally that the amount of phosphoric acid used in the treatment method may be independently controlled from the amount of sulfuric acid as dictated by specific process requirements. Thus, a variable phosphoric acid concentration can be applied during a treatment process as desired.

A stream of water vapor is similarly provided from supply reservoir 164 though line 165 to dispense orifice 172. Alternatively, the phosphoric acid can be supplied to the stream of water vapor at line 165. Dispense orifices 170 and 172 may are configured so that the stream of liquid sulfuric acid composition and the stream of water vapor intersect prior to impinging the surface of the substrate. In an embodiment of the present invention, the dispense orifices 170 and 172 are moved together during the treatment to scan across the surface of the substrate. In an embodiment of the present invention, lines 165 and 163 can be linked to form a two orifice nozzle array to assist in positioning control for scanning across the surface of the substrate.

In embodiments of the present invention, a gas inert to the particular species present in the treatment process, such as nitrogen gas, may be directed at the reverse side of the wafer to modulate the wafer temperature and to promote etch uniformity. In a preferred embodiment, a stream of gas is directed to the reverse side of the wafer corresponding to the primary impact area of the mixed acid liquid stream to provide a localized offsetting cooling effect.

In one embodiment of the present invention, the substrate is pretreated with a pretreatment liquid, such as an acid pretreatment, that acts to modify the surface characteristics of the substrate as desired. For example, the substrate may be pretreated with a dilute HF composition to remove any surface oxide that may have formed on the nitride.

In an embodiment of the present invention, a small amount of HF may be included in the mixed acid liquid stream or in the added water. Advantageously, the present process further comprising hot, dilute HF in a small amount, preferably less than 2%, more preferably less than one percent based on total weight of liquid applied to the substrate, may improve the nitride etching rate and selectivity. Appropriate HF solutions and species are described in U.S. Pat. No. 6,835,667, which is incorporated herein by reference.

Wafers are preferably heated to a temperature of at least about 90 degrees C., either before, during or after dispensing of the treatment composition. More preferably, wafers are heated to a temperature of from about 90 degrees C. to about 150 degrees C. In another embodiment, the wafers are heated to a temperature of from about 95 degrees C. to about 120 degrees C. This heating can be carried out, for example, by heating the chamber using radiant heat, introduction of hot water or other liquid solution to the wafer with substantial removal of the heated liquid prior to application of the concentrated sulfuric acid composition, introduction of heated gases to the chamber, and the like.

In one embodiment, the wafers can be pretreated by submerging one or more wafers into a bath of liquid, which may or may not be heated, quickly draining the contents of the bath (e.g. a "quick dump" procedure) and conducting the remaining treatment steps as described below. The bath liquid can be, for example, DI water, DI water containing sulfuric acid, sulfuric acid/hydrogen peroxide mixture, an inert fluid (such as a fluorocarbon), sulfuric acid/ozone mixture, and the like. This embodiment can provide substantial benefit in enhancing throughput of the treatment process by more efficiently treating and/or heating the wafers. An example of a particularly suitable process system that can be used to employ this embodiment is the MAGELLAN™ system commercially available from TEL FSI, Inc., Chaska, Minn.

The method described above may be used to process multiple wafer-like objects simultaneously, as occurs with batches of wafers when being processed in a spray-type processing tool such as the MERCURY™, or ZETA™ spray processors commercially available from TEL FSI, Inc., Chaska, Minn., or the MAGELLAN™ system, also commercially available from TEL FSI Inc., Chaska, Minn.

The present invention is preferably used in single wafer processing applications where the wafers are either moving or fixed. The present invention permits selective removal of silicon nitride at a sufficiently rapid rate to allow economical use of single wafer processing systems. The single wafer system affords superior control of the processing conditions of each wafer, and avoids damage to multiple wafers in the event of catastrophic process failure, because only one wafer is treated at a time.

The use of each of the described embodiments of the present invention as an intermediate process in an in-line wafer treatment process is specifically contemplated as an embodiment.

The following examples illustrate the many embodiments provided above. The following etch data was collected with blanket silicon nitride films (Nitride) deposited using a horizontal furnace at a deposition temperature of 820 degrees C. with no subsequent anneal. Films of SiGe 50% were deposited at 475 degrees C. with no subsequent anneal. Films of un-doped polycrystalline silicon (Poly) were deposited to a thickness of about 2000 Angstroms. All wafers were deglazed in order to remove native oxide. The deglaze process uses 100:1 HF (100 volume parts DI water mixed with 1 volume part 49wt % HF) for 45 s (seconds) at room temperature (RT).

Examples 1-10 used a mixture of phosphoric acid and sulfuric acid coupled with steam injection as a silicon nitride etching agent (labeled PhosSul+ in the examples below). The same PhosSul+ process conditions were used in each example and are shown in Table 1 below.

Preheat/Pretreatment process conditions were varied in order to reduce or minimize the Poly and SiGe loss associated with the etching of these materials using the same PhosSul+ dispense conditions.

TABLE 1

| | PhosSul Dispense Conditions | | | | | | | | |
|---|---|---|---|---|---|---|---|---|---|
| | Dispense Time (s) | $H_3PO_4$ Flow (cc/min) | $H_2SO_4$ Flow (cc/min) | $H_3PO_4$ Temp (C.) | $H_2SO_4$ Temp (C.) | Steam Inject | Wafer RPM | DH N2 Flow (slm) | DH Height (mm) | Backside N2 Flow (slm) |
| Critical PhosSul + Process Variables | 60 or 120 | 200 | 800 | 165 | 220 | Yes | 240 | 80 | 3.5 | 65 |

EXAMPLE 1

Nitride w/deglaze: $H_2SO_4$ Only Preheat/Pretreatment, followed by 60 s PhosSul+ Etch, resulted in an etch amount of 143.4 A (Angstroms).

EXAMPLE 2

Poly w/deglaze: $H_2SO_4$ Only Preheat/Pretreatment, followed by 60 s PhosSul+ Etch, resulted in an etch amount of 162.5 A. For the conditions in Examples 1 and 2, the inventors observed an increased etch amount for Poly relative to Nitride.

Examples 1 and 2 used the Preheat/Pretreatment conditions of Table 2.

TABLE 2

| | Preheat/Pretreatment Dispense | | | | | | | | | |
|---|---|---|---|---|---|---|---|---|---|---|
| | Dispense Time (s) | H2O2 Flow (cc/min) | H2SO4 Flow (cc/min) | H2O2 Temp (C.) | H2SO4 Temp (C.) | Steam Inject | Wafer RPM | DH N2 Flow (slm) | DH Height (mm) | Backside N2 Flow (slm) |
| Critical Pretreatment Process Variables | 30 | 0 | 1000 | RT | 220 | No | 200 | 80 | 3.5 | 65 |

EXAMPLE 3

Nitride w/deglaze: SC-1, followed by $H_2SO_4$ Preheat/Pretreatment, followed by 120 s PhosSul+ Etch, resulted in an etch amount of 338.2 A.

EXAMPLE 4

Poly w/deglaze: SC-1, followed by $H_2SO_4$ Only Preheat/Pretreatment, followed by 120 s PhosSul+ Etch, resulted in an etch amount of 430.5 A. For the conditions in Examples 3 and 4, the inventors observed an increased etch amount for Poly relative to Nitride.

Examples 3 and 4 used the Preheat/Pretreatment conditions of Table 3.

Examples 5-10, 11, and 12 used a mixture of sulfuric acid and hydrogen peroxide coupled with steam injection as an oxidizing agent (labeled ViPR+ in the examples below).

EXAMPLE 6

Poly w/deglaze: 30 s ViPR+ Preheat/Pretreatment, followed by 60 s PhosSul+ Etch, followed by 30 s ViPR+ Preheat/Pretreatment, followed by 60 s PhosSul+ Etch, resulted in an etch amount of 11.8 A. For the conditions in Examples 5 and 6, the inventors observed an increased etch amount for Nitride relative to Poly, wherein a Preheat/Pretreatment step including an oxidizing step, e.g., ViPR+ Preheat/Pretreatment, has been inserted prior to dispensing a silicon nitride etching agent, e.g., PhosSul+ Etch (two cycles of multi-step process).

Examples 5 and 6 used the Preheat/Pretreatment dispense conditions of Table 4, e.g., ViPR+, before the first 60 s PhosSul+ dispense and again before the second 60 s PhosSul+ dispense.

TABLE 3

| | Preheat/Pretreatment Dispense | | | | | | | | | |
|---|---|---|---|---|---|---|---|---|---|---|
| | Dispense Time (s) | H2O2 Flow (cc/min) | NH4OH Flow (cc/min) | H2O Flow (cc/min) | SC1 Temp (C.) | Steam Inject | Wafer RPM | DH N2 Flow (slm) | DH Height (mm) | Backside N2 Flow (slm) |
| Critical Pretreatment Process Variables | 20 | 40 | 20 | 2138 | 70 | No | 600 | 150 | 6 | 0 |

EXAMPLE 5

Nitride w/deglaze: 30 s ViPR+ Preheat/Pretreatment, followed by 60 s PhosSul+ Etch, followed by 30 s ViPR+ Preheat/Pretreatment, followed by 60 s PhosSul+ Etch, resulted in an etch amount of 308.0 A.

TABLE 4

| | Preheat/Pretreatment Dispense | | | | | | | | | |
|---|---|---|---|---|---|---|---|---|---|---|
| | Dispense Time (s) | H2O2 Flow (cc/min) | H2SO4 Flow (cc/min) | H2O2 Temp (C.) | H2SO4 Temp (C.) | Steam Inject | Wafer RPM | DH N2 Flow (slm) | DH Height (mm) | Backside N2 Flow (slm) |
| Critical Pretreatment Process Variables | 30 | 85 | 850 | RT | 220 | Yes | 200 | 80 | 3.5 | 65 |

EXAMPLE 7

Nitride w/deglaze: 45 s ViPR+ Preheat/Pretreatment, followed by 120 s PhosSul+ Etch, resulted in an etch amount of 264.8 A.

EXAMPLE 8

Poly w/deglaze: 45 s ViPR+ Preheat/Pretreatment, followed by 120 s PhosSul+ Etch, resulted in an etch amount of 18.7 A. For the conditions in Examples 7 and 8, the inventors observed an increased etch amount for Nitride relative to Poly, wherein a Preheat/Pretreatment step including an oxidizing step, e.g., ViPR+ Preheat/Pretreatment, has been inserted prior to dispensing a silicon nitride etching agent, e.g., PhosSul+ Etch.

Examples 7 and 8 used the Preheat/Pretreatment conditions of Table 5.

TABLE 5

| | Preheat/Pretreatment Dispense | | | | | | | | | |
|---|---|---|---|---|---|---|---|---|---|---|
| | Dispense Time (s) | $H_2O_2$ Flow (cc/min) | $H_2SO_4$ Flow (cc/min) | $H_2O_2$ Temp (C.) | $H_2SO_4$ Temp (C.) | Steam Inject | Wafer RPM | DH $N_2$ Flow (slm) | DH Height (mm) | Backside $N_2$ Flow (slm) |
| Critical Pretreatment Process Variables | 45 | 85 | 850 | RT | 195 | Yes | 200 | 80 | 3.5 | 65 |

EXAMPLE 9

Nitride w/deglaze: 15 s ViPR+ Preheat/Pretreatment, followed by 120 s PhosSul+ Etch, resulted in an etch amount of 293.7 A.

EXAMPLE 10

Poly w/deglaze: 15 s ViPR+ Preheat/Pretreatment, followed by 120 s PhosSul+ Etch, resulted in an etch amount of 12.2 A [Observation of non-uniformity, wherein some wafers have areas that measure 55A Poly etch due to incomplete oxidation during ViPR+ step.

Examples 9 and 10 used the Preheat/Pretreatment conditions of Table 6.

TABLE 6

| | Preheat/Pretreatment Dispense | | | | | | | | | |
|---|---|---|---|---|---|---|---|---|---|---|
| | Dispense Time (s) | $H_2O_2$ Flow (cc/min) | $H_2SO_4$ Flow (cc/min) | $H_2O_2$ Temp (C.) | $H_2SO_4$ Temp (C.) | Steam Inject | Wafer RPM | DH $N_2$ Flow (slm) | DH Height (mm) | Backside $N_2$ Flow (slm) |
| Critical Pretreatment Process Variables | 15 | 85 | 850 | RT | 205 | Yes | 200 | 80 | 3.5 | 65 |

Examples 11-16 used the same PhosSul+ process conditions and are shown in the Table 7.

TABLE 7

| | PhosSul + Dispense Conditions | | | | | | | | | |
|---|---|---|---|---|---|---|---|---|---|---|
| | Dispense Time (s) | $H_3PO_4$ Flow (cc/min) | $H_2SO_4$ Flow (cc/min) | $H_3PO_4$ Temp (C.) | $H_2SO_4$ Temp (C.) | Steam Inject | Wafer RPM | DH $N_2$ Flow (slm) | DH Height (mm) | Backside $N_2$ Flow (slm) |
| Critical PhosSul Process Variables | 60 | 200 | 800 | 165 | 220 | Yes | 240 | 80 | 3.5 | 65 |

EXAMPLE 11

SiGe 30% w/deglaze: $H_2SO_4$ Only Preheat/Pretreatment, followed by 60 s PhosSul+ Etch, resulted in an etch amount of 275.2 A.

EXAMPLE 12

SiGe 30% w/deglaze: 45 s ViPR+ Preheat/Pretreatment, followed by 60 s PhosSul+ Etch, resulted in an etch amount of 33.1 A. The inventors observed a decreased etch amount of SiGe 30% when an oxidizing step has been inserted prior to dispensing a silicon nitride etching agent.

Examples 11 and 12 used the Preheat/Pretreatment conditions of Table 8.

TABLE 8

| | Preheat/Pretreatment Dispense | | | | | | | | |
|---|---|---|---|---|---|---|---|---|---|
| | Dispense Time (s) | H2O2 Flow (cc/min) | H2SO4 Flow (cc/min) | H2O2 Temp (C.) | H2SO4 Temp (C.) | Steam Inject | Wafer RPM | DH N2 Flow (slm) | DH Height (mm) | Backside N2 Flow (slm) |
| Critical Pretreatment Process Variables | 45 | 85 | 800 | RT | 220 | Yes | 200 | 80 | 5 | 30 |

EXAMPLE 13

SiGe 50% w/deglaze: $H_2SO_4$ Only Preheat/Pretreatment, followed by 60 s PhosSul+ Etch, resulted in an etch amount of 67.5 A.

EXAMPLE 14

SiGe 50% w/deglaze: 45 s ViPR+ Preheat/Pretreatment, followed by 60 s PhosSul+ Etch, resulted in an etch amount of 69.8 A.

TABLE 9

| | Preheat/Pretreatment Dispense | | | | | | | | |
|---|---|---|---|---|---|---|---|---|---|
| | Dispense Time (s) | H2O2 Flow (cc/min) | H2SO4 Flow (cc/min) | H2O2 Temp (C.) | H2SO4 Temp (C.) | Steam Inject | Wafer RPM | DH N2 Flow (slm) | DH Height (mm) | Backside N2 Flow (slm) |
| Critical Pretreatment Process Variables | 45 | 85 | 800 | RT | 220 | Yes | 200 | 80 | 5 | 30 |

Examples 13 and 14 used the Preheat/Pretreatment conditions of Table 9.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

The invention claimed is:

1. A method for selectively removing silicon nitride in a spray processing system, comprising:
   (a) providing a substrate having a surface with silicon nitride exposed on at least one portion of said surface and $SiGe_x$, wherein x is greater than or equal to zero, exposed on at least another portion of said surface;
   (b) dispensing sulfuric acid and an oxidizing agent as a mixture onto said surface of said substrate in the presence of water vapor to oxidize said exposed $SiGe_x$; and
   (c) following step (b), dispensing a silicon nitride etching agent as a liquid stream onto said surface of said substrate to remove at least a portion of said silicon nitride: wherein steps (b) and (c) are carried out in a spray processing system further comprising:
   repeating steps (b) and (c) two or more cycles to selectively remove a target amount of said silicon nitride.

2. The method of claim 1, further comprising:
   prior to step (c), dispensing a heating agent onto said surface of said substrate to pre-heat said substrate to a target temperature.

3. The method of claim 2, wherein said target temperature exceeds 150 degrees C.

4. The method of claim 2, wherein step (b) and dispensing said heating agent are performed simultaneously.

5. The method of claim 1, wherein said sulfuric acid is heated to a temperature in excess of 150 degrees C.

6. The method of claim 1, wherein said sulfuric acid is heated to a temperature in excess of 200 degrees C.

7. The method of claim 1, wherein water is further added to said mixture of sulfuric acid and oxidizing agent.

8. The method of claim 1, wherein said mixture containing sulfuric acid and oxidizing agent is dispensed from a first array of injection openings located above said substrate, and said water vapor is dispensed from a second array of openings.

9. The method of claim 8, wherein said first array of openings and said second array of openings are oriented relative to one another to allow said mixture of sulfuric acid and oxidizing agent and said water vapor to mix in a space above said substrate.

10. The method of claim 9, wherein said first array of openings and said second array of openings are distributed radially along a spray arm that extends above said substrate from approximately a central region of said substrate to approximately a peripheral region of said substrate.

11. The method of claim 10, wherein said substrate is rotated while dispensing said mixture of sulfuric acid and oxidizing agent and said water vapor.

12. The method of claim 1, wherein step (c) comprises dispensing phosphoric acid and sulfuric acid onto said surface of said substrate as a mixed acid liquid stream at a temperature greater than about 150 degrees C.

13. The method of claim 12, wherein steps (b) and (c) remove said silicon nitride at a rate in excess of 20 times greater than said oxidized, exposed $SiGe_x$.

14. The method of claim 13, wherein water is added to a liquid solution of said mixed acid liquid stream as or after said liquid solution of said mixed acid liquid stream passes through a nozzle.

15. The method of claim 12, wherein said substrate is rotated during the dispensing of the mixed acid stream.

16. The method of claim 12, wherein said mixed acid liquid stream is flowed onto said substrate in the form of a continuous stream or is sprayed onto said substrate in the form of liquid aerosol droplets.

17. The method of claim 12, wherein:
said phosphoric acid and sulfuric acid are mixed in a vessel for storage prior to dispensing from a nozzle as said mixed acid liquid stream, or
said phosphoric acid and sulfuric acid are mixed in-line at a location upstream from a nozzle to form said mixed acid liquid stream,
or said phosphoric acid and sulfuric acid are mixed in a nozzle assembly prior to being ejected from a nozzle as said mixed acid liquid stream, or
said phosphoric acid and sulfuric acid are dispensed as separate liquid solutions in the form of streams from separate orifices of a nozzle assembly, which separate streams then impinge and form said mixed acid liquid stream externally of the nozzle and prior to contact with said surface of said substrate, or
said phosphoric acid and sulfuric acid are dispensed from one or more nozzles, or a nozzle assembly, to form said mixed acid liquid stream, and water is dispensed separate from said phosphoric acid and sulfuric acid and mixed with said mixed acid liquid stream prior to contact with said surface of said substrate, or
said phosphoric acid and sulfuric acid are dispensed from one or more nozzles, or a nozzle assembly, to form said mixed acid liquid stream, and steam is dispensed separate from said phosphoric acid and sulfuric acid and mixed with said mixed acid liquid stream prior to contact with said surface of said substrate.

* * * * *